United States Patent [19]
Helms et al.

[11] Patent Number: 5,604,708
[45] Date of Patent: Feb. 18, 1997

[54] FAIL-SAFE SYSTEM FOR PRESERVING A BACKUP BATTERY

[75] Inventors: Frank Helms, Round Rock; Alan E. Brown, Georgetown, both of Tex.

[73] Assignee: Dell USA L.P., Austin, Tex.

[21] Appl. No.: 378,169

[22] Filed: Jan. 25, 1995

[51] Int. Cl.$^6$ .................................................. G11C 11/40
[52] U.S. Cl. ........................................... 365/229; 365/226
[58] Field of Search .................................. 365/229, 228, 365/226, 189.09

[56] References Cited

U.S. PATENT DOCUMENTS

| | | | |
|---|---|---|---|
| 4,451,742 | 5/1984 | Aswell | 365/229 |
| 4,712,196 | 12/1987 | Uesugi | 365/229 |
| 4,884,242 | 11/1989 | Lacy | 365/229 |
| 4,907,183 | 3/1990 | Tanaka | 365/229 |
| 5,007,027 | 4/1991 | Shimoi | 365/229 |

*Primary Examiner*—A. Zarabian
*Attorney, Agent, or Firm*—Stanford & Bennett

[57] ABSTRACT

A fail-safe system for monitoring the voltage of a backup battery of a portable computer system to prevent excessive drainage of the backup battery. The backup battery is primarily provided to maintain voltage to the configuration memory of the portable computer during swapping of the main battery. A timing circuit allows the backup battery to provide power to other, low power system components for a limited time, such as two minutes, while the main battery is being replaced. In the fail-safe circuit, a comparator circuit monitors the voltage of the backup battery and asserts a signal in the event its voltage falls to a predetermined minimum level. A switch circuit correspondingly disconnects the backup battery from the other system components, thereby conserving the energy of the backup battery. Thus, if the timing circuit should fail or if the energy of the backup battery is too low, the fail-safe system prevents excessive drainage of the backup battery to maintain sufficient energy for the configuration memory.

13 Claims, 2 Drawing Sheets

FAIL-SAFE SYSTEM FOR PRESERVING A BACKUP BATTERY

FIELD OF THE INVENTION

The present invention relates to battery powered computer systems, and more particularly to a fail-safe system for preventing substantial discharge of a backup battery.

DESCRIPTION OF RELATED ART

Portable computer systems, such as laptop and notebook computers, are typically powered either through an AC adapter or through a main rechargeable battery, such as a nickel cadmium (NiCd) or nickel metal hydride (NiMh) battery. If a user anticipates the need to operate the computer for an extended period of time where AC power is unavailable, the user typically provides one or more spare charged batteries. More sophisticated portable computer systems allow the user to replace a discharged battery with a charged battery while the computer system is still operating. To achieve this, a backup battery, such as a low milli amper rechargeable NiCd battery or its equivalent, is provided for maintaining power to the configuration memory of the computer system for a relatively short period of time while the main battery is being replaced. The voltage of the backup battery is typically less than a completely discharged main battery, so that the computer circuitry easily detects the occurrence of the battery change.

Originally, the backup battery was not used to power the entire system during the battery change, but was instead used to maintain sufficient voltage to the configuration memory to prevent memory loss. The configuration memory of a portable computer system typically comprises complimentary metal-oxide semiconductor (CMOS) type circuitry which consumes a relatively small amount of power. Thus, although the backup battery is relatively small and stores a correspondingly small amount of energy as compared to the main battery, it is able to maintain the retention level of CMOS memory for an extended time period since CMOS memory consumes little energy.

It is common to use the backup battery to temporarily provide power to certain devices or components other than the configuration memory of a portable computer while swapping the main battery. Note: it should be understood that the backup battery provides temporary power to these devices, if these devices have been placed in a low power mode, rather than normal mode of operation. Other components of the computer, such as the liquid crystal display (LCD), consume too much power to be operated by the backup battery, and are thus usually shut down during battery swapping. If power is provided to low power devices other than the configuration memory, it is not desired to maintain this power to those other devices for an appreciable period of time. In fact, the computer system often includes a timer circuit which disconnects the temporary power from the other components after a certain maximum amount of time to avoid excessive drainage. This period of time is typically about two minutes. Thus, the situation of powering components other than the configuration memory is allowed to occur for a reasonable, although relatively short, amount of time to allow battery swapping. If the timer times out, the power to these remaining components is switched off so that the sole drain of the backup battery is the configuration memory.

It has been discovered that there are several problems with the present practice of using a backup battery to provide power to other components in the computer system. For one, the exact state of the backup battery is unknown by the system at the beginning of a battery swap. Thus, it is very possible that the condition of the backup battery is very poor and thus unable to maintain the CMOS retention level of configuration memory while trying to provide power to other devices. If the condition of the backup battery is poor, memory loss could occur during this two minute battery exchange period. Furthermore, the computer system occasionally locks up during the temporary battery swap period, thereby disabling the two minute timer. This situation is undesirable since the backup battery is then significantly drained by the computer system in a relatively short amount of time, often resulting in configuration memory loss.

It is desirable therefore, to allow the continued use of the backup battery to maintain power to the configuration memory and to certain other low power components which have been placed in a low power mode in the computer system during the two minute battery swap period. However, it is not desired to provide this extraneous power at all if the condition of the backup battery is poor, or for very long if the computer system locks up. Thus, it is desired to remove any power drain other than configuration memory from the backup battery in the event the voltage of the backup battery becomes too low.

SUMMARY OF THE PRESENT INVENTION

A fail-safe system according to the present invention monitors the voltage of the backup battery and disconnects the backup battery from components in the computer system other than the configuration memory in the event the voltage of the backup battery falls to a predetermined minimum level. A comparator circuit receiving power from the backup battery continually monitors the voltage of the backup battery and operates a switch circuit for removing extraneous power drain in the event the voltage of the backup battery drops to the predetermined minimum level. This predetermined minimum voltage level is preferably established using a voltage reference such as a Zener diode. The switch circuit preferably comprises transistors, and more particularly includes a bipolar transistor for switching a metal-oxide semiconductor field-effect transistor (MOSFET) having a controlled current path coupled between the backup battery and the low power components receiving temporary power. The source and drain current path provides a very low impedance drop while the MOSFET is switched on, but otherwise imposes a very large impedance sufficient to isolate and thereby preserve the backup battery.

A second switch circuit receiving a signal from the microprocessor also disconnects any extraneous components in the preferred embodiment. The two switch circuits are coupled such that either one performs the disconnect function. In this manner, the present invention provides a fail-safe mechanism to remove unnecessary drain from the backup battery in the event its voltage falls below a predetermined minimum level. This allows the backup battery to maintain power to the configuration memory for a longer period of time if the timer circuit fails or if the computer locks up.

A feature of the present invention includes the ability of alerting a user to the ability of the secondary battery to perform a warm swap. Such a feature will let the user know whether he can, in fact, perform a warm swap, or whether it is necessary to power down the computer before performing a battery swap. It should be appreciated that notification to the user of the status of the secondary battery may be provided by numerous means including LCD status indicators, front panel LED's, or audibly.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

Figure 1:
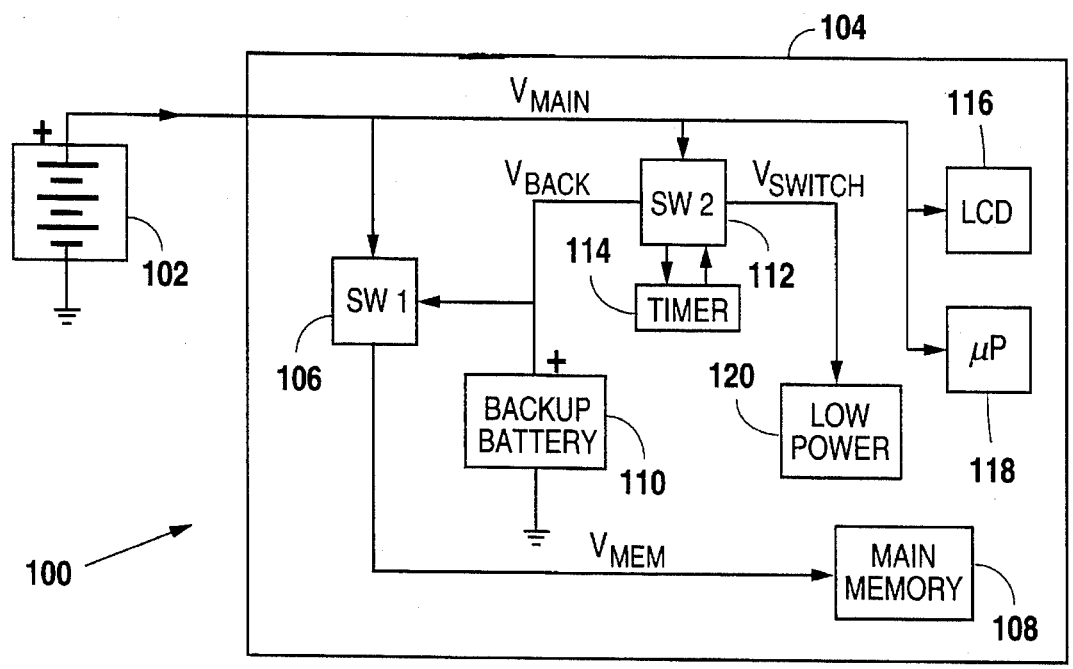
FIG. 1 is a simplified block diagram of a computer system according to the prior art.

Referring now to FIG. 1, a simplified block diagram is shown of a computer system 100 according to prior art. A removeably connected main battery 102, typically comprising a plurality of nickel cadmium (NiCd) or nickel metal hydride (NiMh) cells, provides the primary power voltage, referred to as $V_{MAIN}$, to a computer 104. Within the computer 104, the $V_{MAIN}$ signal is provided to a first switch circuit 106, which provides a signal $V_{MEM}$ to provide power to the configuration memory 108 from the main battery 102. The configuration memory 108 typically comprises CMOS memory devices or the like for low power consumption. A backup battery 110 provides a power voltage signal $V_{BACK}$ to the switch circuit 106. If the main battery 102 is removed, the switch circuit 106 automatically switches to the $V_{BACK}$ signal to provide power via the $V_{MEM}$ signal to the configuration memory 108 from the backup battery 108. Normally, the backup battery 110 will provide sufficient voltage to maintain the retention level of the configuration memory 108 for an extended period of time, thereby saving any data stored therein. It is noted that the voltage of the backup battery 110 is typically less than the nominal voltage level of the main battery 102 to allow the switch circuit 106 to detect the absence of the main battery 102. The switch circuit 106 may be very simple, such as a diode circuit as known to those skilled in the art. However, the relative voltage of the batteries 102, 110 and the particular configuration of the switch circuit 106 is a matter of design choice and not intended to limit the present invention.

The $V_{MAIN}$ signal from the main battery 102 is provided directly to the primary power consuming elements of the computer 104, such as the LCD display 116, the microprocessor 118 and other devices which consume relatively large amounts of power during normal operation. The $V_{MAIN}$ and $V_{BACK}$ Signals are both provided to a second switch circuit 112 for providing a switched power signal $V_{SWITCH}$ to relatively low power devices within the computer 104, such as clock and timing circuits, keyboard functions, etc., collectively referred to as the low power devices 120. The switch circuit 112 operates in a similar manner as the switch circuit 106 in that it switches to provide power from the main battery 102 to the low power devices 120 while the main battery 102 is present, but otherwise provides power from the backup battery while the main battery 102 is disconnected. However, a timer circuit 114 connected to the second switch circuit 112 detects the removal of the main battery 102 and initiates a predetermined time period, which is typically about two minutes in most portable computer systems, representing a desired maximum amount of time to operate the low power devices 120 from the backup battery 110. If the predetermined time period elapses while the main battery 102 is disconnected, the timer circuit 114 asserts a signal or otherwise causes the switch circuit 112 to disconnect the $V_{BACK}$ signal and remove the $V_{SWITCH}$ signal from the low power devices 120. This prevents unnecessary drainage of the backup battery 110, which is primarily needed to provide power for maintaining the data within the configuration memory 108.

The prior art circuit shown in FIG. 1 is deficient for several reasons. The state of the backup battery 110 is relatively unknown when the main battery 102 is first removed. Therefore, during the predetermined time period while the switch circuits 106, 112 are providing power from the backup battery 110 to the configuration memory 108 and the lower power devices 120, the voltage of the backup battery 110 may fall below the CMOS retention voltage level required by the configuration memory 108. This situation is undesirable since the data within the configuration memory 108 is lost and likely unrecoverable. It has also been observed that while the main battery 102 is disconnected, the computer 104 occasionally locks up thereby disabling the timer circuit 114. Should the main battery 102 be removed for an extended period of time, the backup battery 110 continues to provide power to the low power devices 120 and the configuration memory 108. This situation is not desirable since the voltage of the backup battery 110 will eventually fall below the retention level of the configuration memory 108, resulting in memory loss.

Figure 2:
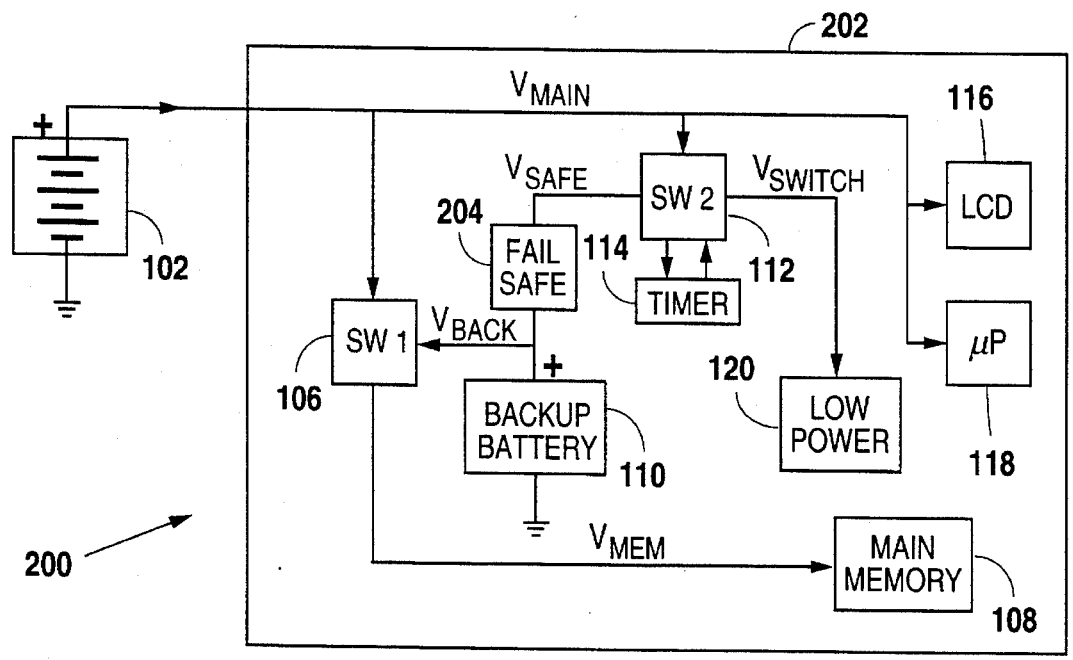
FIG. 2 is a simplified block diagram of a computer system according to the present invention.

Referring now to FIG. 2, a simplified block diagram of a computer system 200 according to the present invention is shown. Similar components retain identical reference numerals as that of FIG. 1. In particular, the main battery 102 provides power to a computer 202, which further includes the switch circuit 106, the configuration memory 108, the backup battery 110, the switch circuit 112, the timer circuit 114, the LCD 116, the microprocessor 118 and the low power devices 120. However, the $V_{BACK}$ signal from the backup battery 110 is provided to a fail-safe circuit 204 according to the present invention, which provides a signal $V_{SAFE}$ to the switch circuit 112. The fail-safe circuit 204 preferably provides power from the backup battery 110 to the switch circuit 112 via the $V_{SAFE}$ signal. However, the fail-safe circuit 204 also monitors the voltage of the backup battery 110 and disconnects the $V_{SAFE}$ signal in the event the voltage of the backup battery 110 falls below a predetermined minimum level. This predetermined minimum voltage level is sufficient to maintain power to the configuration memory 108 for a certain minimum period of time, but not sufficient to continue providing power to the low power devices 120. The particular voltage level is a design choice which depends on the specific backup battery and memory devices used as well as the desired period of time to maintain data storage.

Figure 3:
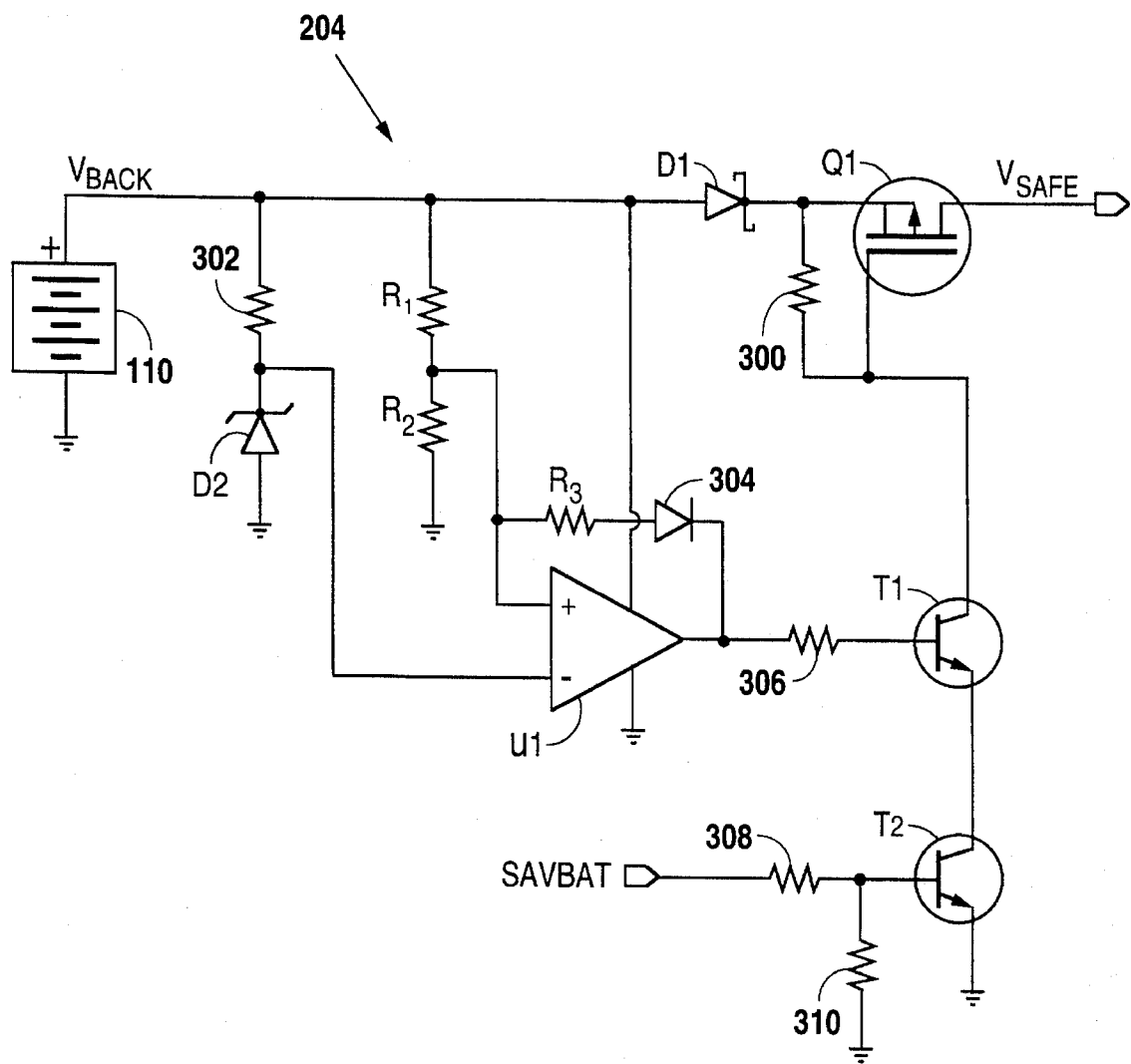
FIG. 3 is a schematic diagram of one embodiment of the fail-safe circuit of FIG. 2.

Referring now to FIG. 3, a schematic diagram is shown of one embodiment of the fail-safe circuit 204 according to the present invention. The backup battery 110 has its negative terminal connected to ground and its positive terminal connected to the anode of a diode D1, which has its cathode connected to one end of a resistor 300 and to the source of a p-channel metal-oxide semiconductor field-effect transistor (MOSFET) Q1. The diode D1 is preferably a Schottky barrier diode which has a relatively small forward voltage (typically about 0.5 volts) and exhibits fast switching. The other end of the resistor 300 is connected to the gate of the MOSFET Q1 which has its drain providing the $V_{SAFE}$ signal. The $V_{BACK}$ signal is also provided to one end of a resistor 302, having its other end connected to the cathode of a Zener diode D2, which has its anode connected to ground. The cathode of the Zener diode D2 is provided to the negative input of a comparator U1, which receives power through the $V_{BACK}$ signal from the backup battery 110.

The $V_{BACK}$ signal is provided to one end of a resistor R1, having its other end connected to one end of a resistor R2, which has its other end connected to ground. The junction between the resistors R1, R2 is provided to the positive input of the comparator U1 and to one end of a hysteresis resistor R3. The other end of the resistor R3 is connected to the anode of a diode 304, having its cathode connected to the output of the comparator U 1. The output of the comparator U1 is also connected to one end of a resistor 306, having its other end connected to the base of a bipolar npn transistor T1. The collector of the transistor T1 is connected to the gate of MOSFET Q1, and its emitter is connected to the collector of another npn bipolar-polar transistor T2. The emitter of the transistor T2 is connected to ground and its base is connected to the junction of two resistors 308, 310, where the other end of the resistor 310 is connected to ground and the other end of the resistor 308 receives a signal SAVBAT from the microprocessor 118 of the computer 202. The circuit including the transistors T1, T2, the MOSFET Q1 and the diode D1 comprises another switch circuit for disconnecting the backup battery 110 from the low power devices 120, as described below.

Operation of the fail-safe circuit 204 is as follows. While the main battery 102 is connected, the diode D2 is reversed biased thereby disconnecting the backup battery 110 from the low power devices 120. When the main battery 102 is removed and the switch circuit 112 switches power from the backup battery 110 to the low power devices 120 within the computer 202, the voltage of the backup battery 110 forward biases the diode D1, assuming the transistors T1 and T2 and the MOSFET Q1 are on. In this manner, the backup battery 110 provides power through the $V_{SAFE}$ signal to the low power devices 120. The diode D1 prevents voltage from a main battery 102 suddenly connected from back-charging through the switch circuit 112 and the internal diode of the MOSFET Q1 to the backup battery 110.

The nominal voltage of the Zener diode D2 and the resistors R1, R2 effectively establish a minimum desired voltage level for the backup battery 110. The resistor 302 is chosen to prevent significant drainage of the backup battery 110 and to develop current through the Zener diode D2. The ratio of the resistors R1, R2 is chosen such that the voltage at the junction of the resistors R1, R2 equals the nominal voltage of the Zener diode D2 when the voltage of the backup battery 110 equals the predetermined minimum voltage level. While the voltage of the backup battery 110 is above this predetermined minimum level, the voltage divider comprising the resistors R1, R2 provides a voltage to the positive input of the comparator U1, which is greater than the nominal voltage of the diode D2. In this case, the comparator U1 asserts its output high thereby activating the transistor T1. If the SAVBAT signal is also asserted high thereby activating the transistor T2 on, the gate of the MOSFET Q1 is pulled low, turning the MOSFET Q1 on. This enables the backup battery 110 to provide power through the $V_{SAFE}$ signal.

If the voltage of the backup battery 110 falls at or below the predetermined minimum voltage level, the voltage at the junction of the resistor divider R1, R2 drops below the nominal voltage of the Zener diode D2, thereby causing the comparator U1 to assert its output low, which turns off the transistor T1. The gate of the MOSFET Q1 is pulled high through the resistor 300 thereby turning the MOSFET Q1 off and removing the $V_{BACK}$ signal from the $V_{SAFE}$ signal. Thus, the backup battery 110 no longer provides power to the low power devices 120, but continues to provide power to the configuration memory 108. When the output of the comparator U1 goes low, the diode 304 is forward biased causing current to flow through the resistor R3 creating a hysteresis function. The voltage of the battery 302 must be increased by a certain amount above the predetermined minimum level before the comparator U1 switches back on to turn on the transistor T1. The backup battery 110 must either be recharged or otherwise replaced before the comparator U1 will allow further drainage through the MOSFET Q1.

This function may also be provided by the microprocessor 118 (or other logic circuitry) of the computer 202 by negating the SAVBAT signal low. In that event, the base of the transistor T2 is pulled low through the resistor 310 thereby turning it off and thus turning off the MOSFET Q1. Thus, the microprocessor 118 of the computer 202 disables the $V_{SAFE}$ signal thereby preventing extraneous drain from the backup battery 110 in response to input from the user of the computer 202 or from predefined conditions established in hardware or software. It is noted that both transistors T1 and T2 must be turned on to turn on the MOSFET Q1 to allow the backup battery 110 to provide power to the low power devices 120. The circuit comprising the resistors 308, 310 and the transistor T2 is optional and provided in those embodiments where it is desired to allow the user or other conditions to disconnect the backup battery 110 from the low power devices 120.

It can now be appreciated that a fail-safe circuit according to the present invention allows a backup battery to provide power to certain lower power components in a computer system while the voltage of the backup battery is above a certain predetermined minimum level. However, if the voltage of the backup battery reaches or otherwise falls below this minimum level, the fall-safe circuit according to the present invention removes the backup battery from this extraneous circuitry to prevent excessive drainage. The backup battery, however, continues to provide power to configuration memory. Should a timer circuit ever fail to disconnect the low power devices from the backup battery after a temporary time period has elapsed, a fail-safe circuit according to the present invention prevents excessive drainage of the backup battery.

Although the method and apparatus of the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

We claim:

1. A fail-safe system for preventing excessive drainage of a backup battery used to maintain power to configuration memory of a computer system, the computer system including at least one low power device receiving power from the backup battery during removal of a primary battery and a microprocessor which provides a save battery signal, said fail-safe system comprising:

reference means for coupling to the backup battery for providing a reference signal indicative of a predetermined minimum voltage level of the backup battery;

monitoring mean for coupling to the backup battery for providing a battery voltage signal indicative of the voltage level of the backup battery;

a comparator coupled to said reference means and said monitoring means and for coupling to the backup battery for comparing the voltage of the backup battery with said predetermined minimum voltage level and for providing a disable signal indicative thereof; and a switch circuit coupled to said comparator and for coupling to the backup battery and the low power device, said switch circuit for coupling the backup battery to the low power device if said disable signal indicates that the voltage of the backup battery is above said predetermined minimum voltage level and if the save battery signal is provided, but otherwise disconnecting the backup battery from the low power device while the backup battery continues to maintain power to the configuration memory said switch circuit including:

a first transistor having a control terminal and having a controlled current path for coupling between the backup battery and the low power device;

a second transistor having a control terminal for receiving said disable signal and a current path coupled to said control terminal of said first transistor; and a third transistor having a control terminal for receiving the save battery signal and a current path coupled in series with said current path of said second transistor.

2. The fail-safe system of claim 1, wherein the configuration memory comprises CMOS memory devices.

3. The fail-safe system of claim 1, wherein said reference means includes a Zener diode.

4. The fail-safe system of claim 3, wherein said reference means further includes a current limit resister coupled in series with said Zener diode.

5. The fail-safe system of claim 1, wherein said monitoring means comprises a voltage divider having a junction for providing said battery voltage signal.

6. The fail-safe system of claim 5, wherein said voltage divider comprises two resistors coupled in series.

7. The fail-safe system of claim 4, wherein said comparator compares said battery voltage signal with said reference signal.

8. The fail-safe system of claim 1, wherein said comparator further includes a hysteresis feedback resistor.

9. The fail-safe system of claim 1, wherein said second and third transistors are bipolar transistors and wherein said first transistor is a MOSFET.

10. A computer system including a removeably coupled primary battery for providing main power, comprising:

a microprocessor providing a save battery signal;

memory;

a backup battery for providing power to said memory while the primary battery is removed;

a first switch circuit coupled to said memory and said backup battery for sensing the removal of the primary battery and for coupling said backup battery to said memory while the primary battery is removed;

at least one low power device;

a second switch circuit coupled to said low power device and said backup battery for sensing the removal of the primary battery and for providing power from said backup battery to said low power device when the primary battery is removed;

references means coupled to said backup battery for providing a reference signal indicative of a predetermined minimum voltage level of said backup battery;

monitoring means coupled to said backup for providing a battery voltage signal indicative of the voltage level of said backup battery;

a comparator coupled to said reference means, said monitoring means and said backup battery for comparing the voltage of said backup battery with said predetermined minimum voltage level and for providing a disable signal indicative thereof; and a third switch circuit coupled to said comparator, said backup battery and said second switch circuit and receiving said save battery signal for coupling said backup battery to said low power device if said disable signal indicates that the voltage of said backup battery is above said predetermined minimum voltage level and if said save battery signal is provided, but otherwise disconnecting said backup battery from said low powered device while said backup battery continues providing power to said memory, said third switch circuit including:

a first transistor having a control terminal and having a controlled current path for coupling between said backup battery and said low power device:

a second transistor having a control terminal for receiving said disable signal and a current path coupled to said control terminal of said first transistor; and a third transistor having a control terminal for receiving said save battery signal and a current path coupled in series with said current path of said second transistor.

11. The computer system of claim 10, wherein said reference means includes a Zener diode.

12. The computer system of claim 10, wherein said monitoring means comprises a voltage divider having a junction for providing said battery voltage signal.

13. The computer system of claim 10 wherein said second and third transistors are bipolar transistors and wherein said first transistor is a MOSFET.

* * * * *